(12) United States Patent
Konno

(10) Patent No.: US 7,736,545 B2
(45) Date of Patent: *Jun. 15, 2010

(54) ELECTRODE PASTE FOR SOLAR CELL AND SOLAR CELL ELECTRODE USING THE PASTE

(75) Inventor: Takuya Konno, Tochigi-ken (JP)

(73) Assignee: E.I. du Pont de Nemours and Company, Wilmington, DE (US)

(*) Notice: Subject to any disclaimer, the term of this patent is extended or adjusted under 35 U.S.C. 154(b) by 0 days.

This patent is subject to a terminal disclaimer.

(21) Appl. No.: 12/355,961

(22) Filed: Jan. 19, 2009

(65) Prior Publication Data

US 2009/0126797 A1 May 21, 2009

Related U.S. Application Data

(63) Continuation of application No. 11/975,301, filed on Oct. 18, 2007, now Pat. No. 7,485,245.

(51) Int. Cl.
*H01B 1/22* (2006.01)
*B05D 5/12* (2006.01)

(52) U.S. Cl. ............... 252/512; 252/514; 427/96.1; 136/252

(58) Field of Classification Search ......... 252/512–514; 136/243, 252; 427/96.1
See application file for complete search history.

(56) References Cited

U.S. PATENT DOCUMENTS

| | | | |
|---|---|---|---|
| 4,051,074 A * | 9/1977 | Asada | 252/503 |
| 4,256,513 A | 3/1981 | Yoshida et al. | |
| 4,368,244 A | 1/1983 | Danzig | |
| 4,737,197 A | 4/1988 | Nagahara et al. | |
| 5,645,765 A | 7/1997 | Asada et al. | |
| 2002/0005507 A1 | 1/2002 | Matsumoto | |
| 2004/0104262 A1 | 6/2004 | Mears | |
| 2004/0155227 A1 | 8/2004 | Bechtloff et al. | |
| 2004/0214016 A1 | 10/2004 | Adachi | |
| 2004/0245507 A1* | 12/2004 | Nagai et al. | 252/500 |
| 2006/0001009 A1 | 1/2006 | Garreau-Iles et al. | |
| 2006/0102228 A1 | 5/2006 | Sridharan et al. | |
| 2006/0231801 A1 | 10/2006 | Carroil et al. | |
| 2006/0289055 A1 | 12/2006 | Sridharan et al. | |

FOREIGN PATENT DOCUMENTS

| | | |
|---|---|---|
| DE | 101 16 653 A1 | 10/2002 |
| EP | 1 713 091 A | 10/2006 |
| EP | 1 713 092 A | 10/2006 |
| JP | 1999/330512 A | 11/1999 |
| JP | 2001/015782 A | 1/2001 |
| JP | 2001/127317 A | 5/2001 |
| JP | 2001/313400 A | 11/2001 |
| JP | 2003/152200 A | 5/2003 |
| JP | 2003/223813 A | 8/2003 |
| JP | 2004/146521 A | 5/2004 |
| JP | 2005/243500 A | 9/2005 |
| JP | 2006/302890 A | 11/2006 |
| WO | WO 02/082464 A | 10/2002 |

* cited by examiner

Primary Examiner—Mark Kopec

(57) ABSTRACT

An electrode paste for a solar cell comprising electrically conductive particles, lead-free glass frit, a resin binder and zinc oxide particles, wherein zinc oxide particles having a specific surface area of 6 m$^2$/g or less are contained at 10% by weight or more based on the total amount of zinc oxide.

14 Claims, 3 Drawing Sheets

ELECTRODE PASTE FOR SOLAR CELL AND SOLAR CELL ELECTRODE USING THE PASTE

BACKGROUND OF THE INVENTION

1. Field of the Invention

The present invention relates to an electrode paste for a solar cell and a solar cell electrode using this paste.

2. Technical Background

Electrodes for gathering electrical current are formed in solar cells. An electrode paste containing an electrically conductive component is typically used to form the electrodes. Electrically conductive particles, glass frit and an organic medium are contained in the electrode paste. Various other additives are also contained as necessary.

Pb-based glass frit having various superior characteristics such as sintering characteristics has been used as glass frit. However, from the viewpoint of reducing the burden on the environment, frit has come to be required to be lead-free, and lead-free glass such as Bi-based glass frit is required to be used for the glass frit contained in electrode pastes.

Although electrode paste is fired after being coated onto a solar cell substrate, the firing conditions of lead-free glass tend to be subject to limitations. In other words, in the case of firing an electrode paste containing lead-free glass, the fireable temperature range tends to be narrow, making it difficult to set an optimum firing temperature in consideration of various conditions such as electrode performance, productivity and yield. In addition, in the case the fireable temperature range is extremely narrow; there is increased susceptibility to the occurrence of defective products in the case the firing temperature deviates from the set value for some reason.

Zinc oxide is known to be an additive for electrode pastes. For example, zinc oxide is added for the purpose of improving electrical characteristics and tensile strength in Japanese Patent Application Laid-open No. 2003-152200. Japanese Patent Application Laid-open No. 2005-243500 discloses a technology for adding zinc oxide having a mean particle diameter of 0.001 to 0.1 µm for the purpose of improving electrical continuity and adhesive strength. Japanese Patent Application Laid-open No. 2006-302890 discloses a technology for adding zinc oxide of 7 to 100 nm.

A need exists to provide an electrode paste for use in solar cell manufacture that has a wide range of firing temperature conditions.

BRIEF SUMMARY OF THE INVENTION

The present invention improves sintering characteristics at high temperatures by using zinc oxide having a small specific surface area, namely a large particle diameter.

More specifically, one aspect of the present invention is an electrode paste for a solar cell comprising: electrically conductive particles, lead-free glass frit, a resin binder and zinc oxide particles; wherein, zinc oxide particles having a specific surface area of 6 $m^2$/g or less are contained at 10% by weight or more based on the total amount of zinc oxide.

Another aspect of the present invention is a solar cell electrode formed from an electrode paste for a solar cell comprising: electrically conductive particles, lead-free glass frit, a resin binder and zinc oxide particles; wherein, the zinc oxide is contained in the form of zinc oxide particles having a specific surface area of 6 $m^2$/g or less at 10% by weight or more based on the total amount of zinc oxide.

Use of the electrode paste of the present invention increases the degree of freedom for choosing firing conditions. Consequently, solar cells of higher quality can be obtained by setting firing conditions in consideration of various factors. In addition, the occurrence of defective products caused by a discrepancy between a set temperature and the firing temperature are avoided.

DETAILED DESCRIPTION OF THE INVENTION

Figure 1:
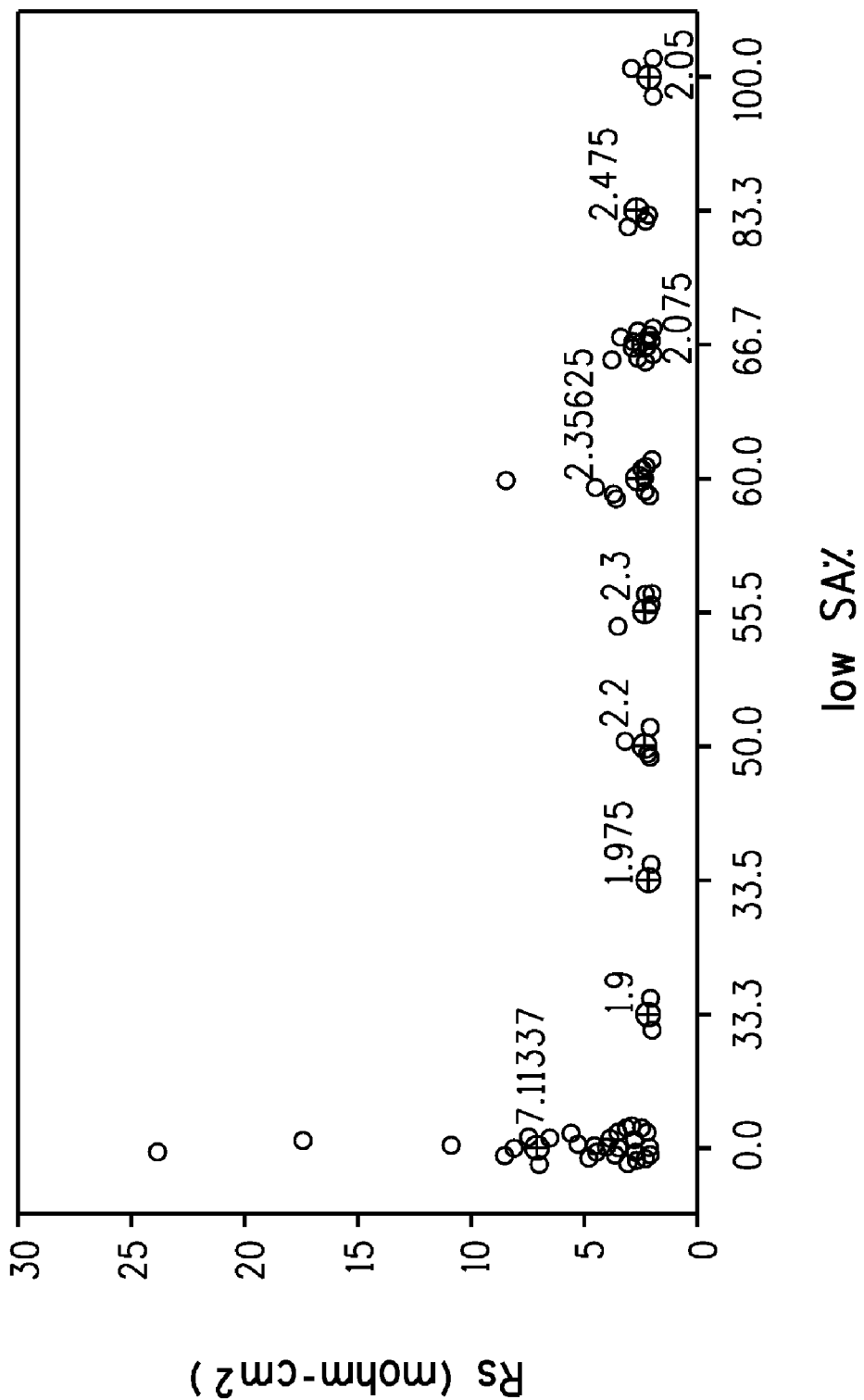
FIG. 1 is a plot showing the correlation between the content of zinc oxide particles having a small specific surface area based on the total amount of zinc oxide particles and series resistance value (Rs)

The present invention relates to an electrode paste for a solar cell comprising electrically conductive particles, lead-free glass frit, a resin binder and zinc oxide particles.

The following provides an explanation of each component of the electrically conductive paste of the present invention.

1. Electrically Conductive Particles

Electrically conductive particles are contained in the paste of the present invention. Examples of electrically conductive particles include silver particles, gold particles, palladium particles, copper particles, aluminum particles and particles of alloys of these metals.

The electrically conductive particles of the present invention can be produced using various known technologies. For example, silver particles can be produced by an atomizing method or a wet reduction method.

Although there are no particular limitations on the mean particle diameter of the electrically conductive particles, the particle diameters are preferably 0.1 to 14 µm and more preferably 1.0 to 8.0 µm. Mean particle diameter is calculated from measured values determined with, for example, the LA-920 Particle Size Distribution Analyzer manufactured by Horiba, Ltd., as the mean particle diameter (50% point).

The electrically conductive particles are preferably of high purity (99% or more). However, substances having lower purity can also be used depending on the electrical requirements of the electrode pattern.

Although there are no particular limitations on the content of the electrically conductive particles in the paste, it is preferably 70 to 90% by weight based on the weight of the paste.

2. Glass Frit

The electrically conductive paste of the present invention contains glass frit as an inorganic binder. Lead-free glass frit substantially not containing lead is used in the present invention. Here, "substantially not containing lead" refers to not containing lead at a content equal to or greater than that of an impurity. However, it is naturally preferable that lead not be detected at all.

Glass binder able to be used in the present invention is glass frit having a softening point of 400° C. to 600° C. so that the electrically conductive paste is fired at 600° C. to 900° C., suitably sintered and moistened and further suitably adhered to a silicon base. If the softening point is lower than 400° C., sintering proceeds excessively thereby preventing the effects of the present invention from being adequately obtained. On the other hand, if the softening point exceeds 600° C., since adequate melt flow does not occur during firing, adequate adhesive strength is not demonstrated and liquid phase sintering of the silver particles or other electrically conductive particles cannot be promoted. Here, "softening point" refers to the softening point obtained according to the fiber elongation method of ASTM C338-57.

A wide range of lead-free glass frit used in electrically conductive paste for electronic materials can be used. For example, lead-free glass such as zinc borosilicate glass may be used.

Although there are no particular limitations on the content of the glass frit provided so that it can enable the objects of the present invention to be achieved, it is preferably 0.5 to 10% by weight and more preferably 1.0 to 3.0% by weight based on the weight of the electrically conductive paste.

If the amount of the glass frit is less than 0.5% by weight, adhesive strength may be inadequate. If the amount of the glass frit exceeds 10% by weight, problems may occur in the subsequent soldering step due to floating glass and the like.

3. Resin Binder

The electrically conductive paste of the present invention contains a resin binder. In the present description, "resin binder" refers to a mixture of polymer and thinner. Thus, an organic liquid (also referred to as thinner) may be contained in the resin binder. In the present invention, a resin binder containing an organic liquid is preferable, and in the case of high viscosity, additional organic liquid can be separately added as a viscosity adjuster as necessary.

Resin binder useful in the present invention includes pine oil solutions of a resin (such as polymethacrylate) or ethyl cellulose, ethylene glycol monobutyl ether monoacetate solutions and terpineol solutions of ethyl cellulose. A terpineol solution of ethyl cellulose (ethyl cellulose content=5 to 50% by weight) is used preferably in the present invention. Furthermore, in the present invention, a polymer-free solvent, such as water or organic liquid, can be used as a viscosity adjuster. Examples of organic liquids that can be used include alcohols, alcohol esters (such as acetates or propionates) and terpenes (such as pine oil or terpineol).

The content of the resin binder is preferably 5 to 50% by weight based on the weight of the electrically conductive paste.

4. Zinc Oxide Particles

Zinc oxide particles are contained in the electrically conductive paste of the present invention. Zinc oxide particles having a small specific surface area, namely large zinc oxide particles, are contained in the present invention. The effects of the present invention tend to be greater the larger the number of zinc oxide particles having a small specific surface area. A prescribed amount or more of zinc oxide particles having a specific surface area of 6 $m^2/g$ or less are preferably contained, and a prescribed amount of zinc oxide particles having a specific surface area of 3 $m^2/g$ or less are more preferably contained. Although there are no particular limitations on the lower limit of specific surface area, excessively large zinc oxide particles are difficult to produce and have the risk of having a detrimental effect on the electrode. Accordingly, although there are no particular limitations on the specific surface area, it is normally 0.1 $m^2/g$ or more.

The specific surface area of the zinc oxide particles is measured by, for example, the BET method.

The optimum content of zinc oxide particles of a prescribed specific surface area or less based on the total amount of zinc oxide particles in the electrically conductive paste of the present invention was estimated from the relationship between the content of the zinc oxide particles and series resistance Rs (see FIG. 1). The following provides a description of that correlation.

FIG. 1 is a plot of series resistance Rs versus the content of zinc oxide particles having a prescribed specific surface area based on the total amount of zinc oxide particles. In FIG. 1, the X axis represents the weight percentage of zinc oxide particles having a specific surface area of 3 $m^2/g$ or less based on the total amount of zinc oxide particles.

As can be determined from this plot, with respect to content, zinc oxide particles having a prescribed specific surface area are preferably contained at 10% by weight or more based on the total amount of zinc oxide particles, and more preferably contained at 30% by weight or more based on the total amount of zinc oxide particles. In addition, there are no particular limitations on the upper limit of content. The entire amount of zinc oxide particles may have a prescribed specific surface area or less depending on the case.

Although there are no particular limitations on the content of zinc oxide particles in the paste, it is preferably 0.1 to 10.0% by weight based on the weight of the paste. If the content is below this range, an adequate reduction in series resistance Rs cannot be obtained. Conversely, if the content exceeds this range, electrode characteristics such as electrode resistance become inferior as a result of sintering of silver being inhibited.

5. Additives

A thickener and/or stabilizer and/or other typical additive may or may not be added to the electrically conductive paste of the present invention. Examples of other typical additives that can be added include dispersants and viscosity adjusters. The amount of additive is determined dependent upon the ultimately required characteristics of the electrically conductive paste. The amount of additive can be suitably determined by a person with ordinary skill in the art. Furthermore, a plurality of types of additives may be added.

As will be explained below, the electrically conductive paste of the present invention preferably has a viscosity within a prescribed range. A viscosity adjuster can be added as necessary to impart a suitable viscosity to the electrically conductive paste. Although the amount of viscosity adjuster added varies dependent upon the final characteristics of the electrically conductive paste, it can be suitably determined by a person with ordinary skill in the art.

The electrically conductive paste of the present invention can be produced by mixing each of the above-mentioned components with a 3-roll kneader. Although the electrically conductive paste of the present invention is preferably coated onto a desired site of the light receiving side of a solar cell by screen printing, it preferably has a viscosity within a prescribed range in the case of being coated by this type of printing. The viscosity of the electrically conductive paste of the present invention is preferably 50 to 300 PaS in the case of measuring at 10 rpm and 25° C. with a Brookfield HBT viscometer using a #14 spindle and a utility cup.

As was previously described, the paste having electrical conductivity of the present invention is used to form an electrode having, for a main component thereof, electrically conductive particles such as silver particles on the light receiving side of a solar cell. The paste of the present invention is printed on the light receiving side of a solar cell and dried. Separate from this, a back electrode composed of aluminum or silver and the like is also formed on the back of the solar cell. These electrodes are preferably fired simultaneously.

The solar cell electrode of the present invention is a solar cell electrode formed from an electrode paste for a solar cell comprising electrically conductive particles, lead-free glass frit, a binder resin and zinc oxide particles, wherein the zinc oxide is contained in the form of zinc oxide particles having a specific surface area of 6 m$^2$/g or less at 10% by weight or more based on the total amount of zinc oxide. Since descriptions of the electrically conductive particles, glass frit, resin binder and zinc oxide particles are the same as previously described, their descriptions are omitted here.

The following provides an example of solar cell production using the electrically conductive paste of the present invention with reference to FIG. 2.

Figure 2A:
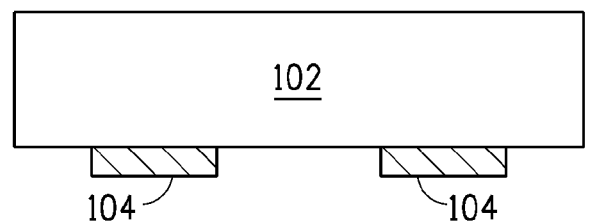
FIGS. 2A to 2D are drawings for explaining the production process when producing a solar cell using the electrically conductive paste of the present invention; and, FIG. 3 is a graph plotting the specific surface area of zinc oxide powder versus Rs values for peak sintering temperature.
Figure 2B:
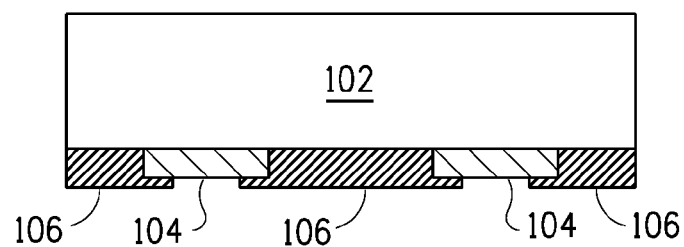

First, a Si substrate 102 is prepared. An electrically conductive paste 104 for soldering connections is coated by screen printing onto the back side of this substrate and dried (FIG. 2A). A conventional electrically conductive paste, such as an electrically conductive silver paste containing silver particles, glass particles and binder resin, can be used for this electrically conductive paste. Next, an aluminum paste 106 for the back electrode of a solar cell (there are no particular limitations thereon provided it is for use with a solar cell, and examples include PV333 and PV332 (E.I. du Pont de Nemours and Company)) is coated by screen printing and the like and dried (FIG. 2B). The drying temperature of each paste is preferably 180° C. or lower. In addition, the film thickness of each electrode on the back of the solar cell as the film thickness after drying is preferably 20 to 40 μm in the case of an aluminum paste and 15 to 30 μm in the case of an electrically conductive silver paste. In addition, the overlapping portion of the aluminum paste and electrically conductive silver paste is preferably about 0.5 to 2.5 mm.

Figure 2C:
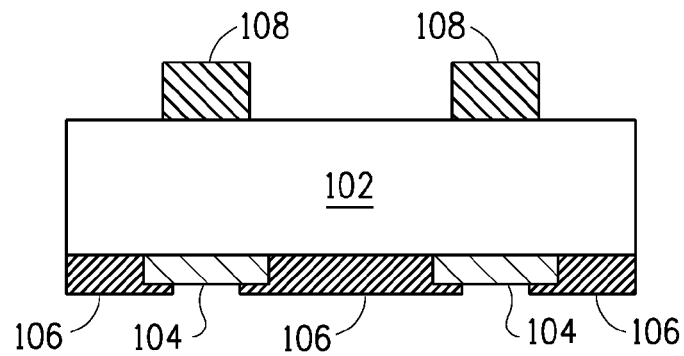

Next, an electrically conductive paste 108 according to the present invention is coated onto the light receiving side (top side) of the Si substrate by screen printing and the like and dried (FIG. 2C). The resulting substrate is then fired while simultaneously firing the aluminum paste and the electrically conductive silver paste, for example, at a temperature of about 600 to 900° C. for about 2 to 15 minutes in an infrared firing furnace to allow the obtaining of the target solar cell (FIG. 2D).

Figure 2D:
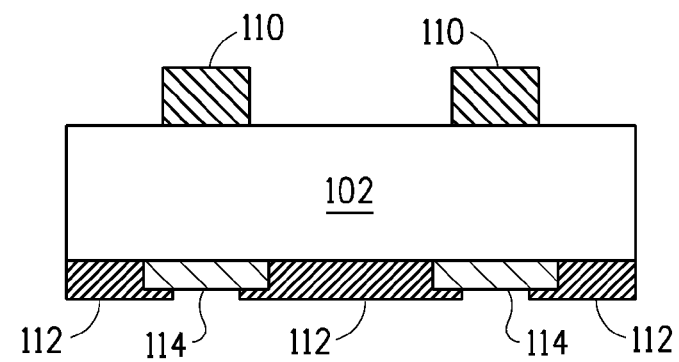

As shown in FIG. 2D, a solar cell obtained using the electrically conductive paste of the present invention has an electrode 110 formed from the electrically conductive paste of the present invention formed on the light receiving side (top side) of substrate (such as an Si substrate) 102, and has an aluminum electrode (first electrode) 112, composed mainly of Al, and a silver electrode (second electrode) 114, composed mainly of Ag, on the back side thereof.

EXAMPLES

1. Preparation of Electrically Conductive Paste

A mixture was prepared containing silver particles (mean particle diameter: 2.5 microns), Si•Bo•O-based glass frit (softening point: 540° C.), zinc oxide powder having a specific surface area of 0.4 m$^2$/g and an additive in the form of a sintering assistant. A resin binder in the form of a terpineol solution containing 20% by weight of ethyl cellulose was added to this mixture. Moreover, a thinner in the form of terpineol was added to adjust viscosity.

After pre-mixing this mixture with a universal mixer, the pre-mixed mixture was kneaded with a 3-roll kneader to obtain a paste for a solar cell electrode.

2. Examples 1 to 3 and Comparative Examples 1 and 2

Electrically conductive pastes of Examples 1 to 3 and Comparative Examples 1 and 2 were prepared according to the electrically conductive paste preparation method described above. The amounts of each component used and the specific surface areas of the zinc oxide particles are shown in Table 1.

TABLE 1

| | | Example 1 | Example 2 | Example 3 | Comparative Example 1 | Comparative Example 2 |
|---|---|---|---|---|---|---|
| Silver | Mean particle diameter (μm) | 2.50 | 2.50 | 2.50 | 2.50 | 2.50 |
| | Wt % | 82.2 | 77.6 | 81.4 | 81.3 | 82.6 |
| Zinc oxide | Specific surface area (m$^2$/g) | 3.0 | 0.4 | 70 and 100 and 3.0 | 70.0 | 9.0 |
| | Wt % | 4.4 | 2.8 | 8.0 | 4.4 | 4.4 |
| | Low specific SA ZnO wt % vs. total ZnO | 100.0 | 100.0 | 33.4 | 100.0 | 100.0 |
| Glass frit | Wt % | 2.5 | 2.5 | 2.5 | 2.5 | 2.5 |
| Organic vehicle | Wt % | 7.0 | 7.0 | 6.0 | 7.0 | 7.0 |
| Additive | Wt % | 0.5 | 0.5 | 0.5 | 0.5 | 0.5 |
| Thinner | Wt % | 3.4 | 9.6 | 1.6 | 4.3 | 3.0 |

3. Production of Solar Cells

Solar cells were produced using the resulting electrically conductive pastes. First, an Si substrate was prepared. An electrically conductive paste (silver paste) for soldering connections was coated onto the back side of the Si substrate by screen printing and dried. Next, an aluminum paste for the back electrode (PV333 (E.I. du Pont de Nemours and Company)) was coated so as to overlap a portion of the dried silver paste by screen printing and then dried. The drying temperature of each paste was 120° C. In addition, the film thickness of each electrode on the back side in terms of the weight after drying was 35 μm for the aluminum paste and 20 μm for the silver paste.

Moreover, a paste of the present invention was coated onto the light receiving side (top side) by screen printing and dried. A printer manufactured by Price Screen Process Pty. Ltd. was used for the printer, and a 250 mesh stainless steel wire mask having an 8-inch×10-inch frame was used for the mask. The pattern consisted of a 1.5-inch square evaluation pattern composed of finger lines having a width of 100 microns and bus bars having a width of 2 mm, and the film thickness after firing was 13 μm.

Next, the resulting substrate was placed in an infrared firing furnace to simultaneously fire the coated pastes under conditions of a set temperature of about 870° C. and IN-OUT of about 5 minutes to obtain the target solar cells.

As shown in FIG. 2, solar cells obtained using an electrically conductive paste of the present invention had Ag electrode 110 on the light receiving side (top side) of substrate (such as an Si substrate) 102, and an Al electrode (first electrode) 112, composed mainly of Al, and a silver electrode (second electrode) 114, composed mainly of Ag, on the back side thereof.

4. Cell Evaluation

Evaluation of the electrical characteristics (I-V characteristics) of the resulting solar cell substrates was carried out with a cell tester. The instrument (NCT-M-150AA) manufactured by Nippon Precision Circuits, Inc. was used for the cell tester.

The series resistance (Rs: $m\Omega \cdot cm^2$) was measured. A low value for Rs indicates superior power generation performance by the solar cell. The results are shown in Table 2.

TABLE 2

| 870° C. | Units | Example 1 | Example 2 | Example 3 | Comparative Example 1 | Comparative Example 2 |
|---|---|---|---|---|---|---|
| Rs | mΩ· cm² | 2.0 | 3.0 | 2.0 | 3.4 | 2.7 |
|  |  | 2.1 | 2.1 | 2.1 | 4.3 | 2.2 |
|  |  | 2.7 | 2.0 | 2.0 | 4.0 | 3.2 |
|  |  | 1.9 | 2.0 | 1.8 | 3.3 | 2.3 |
|  |  | 2.0 |  | 1.8 | 3.1 | 3.2 |
|  |  | 1.9 |  | 1.8 | 3.1 |  |
|  |  | 2.0 |  | 2.0 | 3.5 |  |
|  |  | 1.9 |  | 2.0 | 3.0 |  |
|  |  | 1.9 |  |  | 3.7 |  |
|  |  | 2.1 |  |  | 3.1 |  |
| Avg. |  | 2.0 | 2.3 | 2.0 | 3.4 | 2.7 |

As indicated above, the use of zinc oxide particles having a small specific surface area results in improved characteristics of the resulting solar cell.

Figure 3:
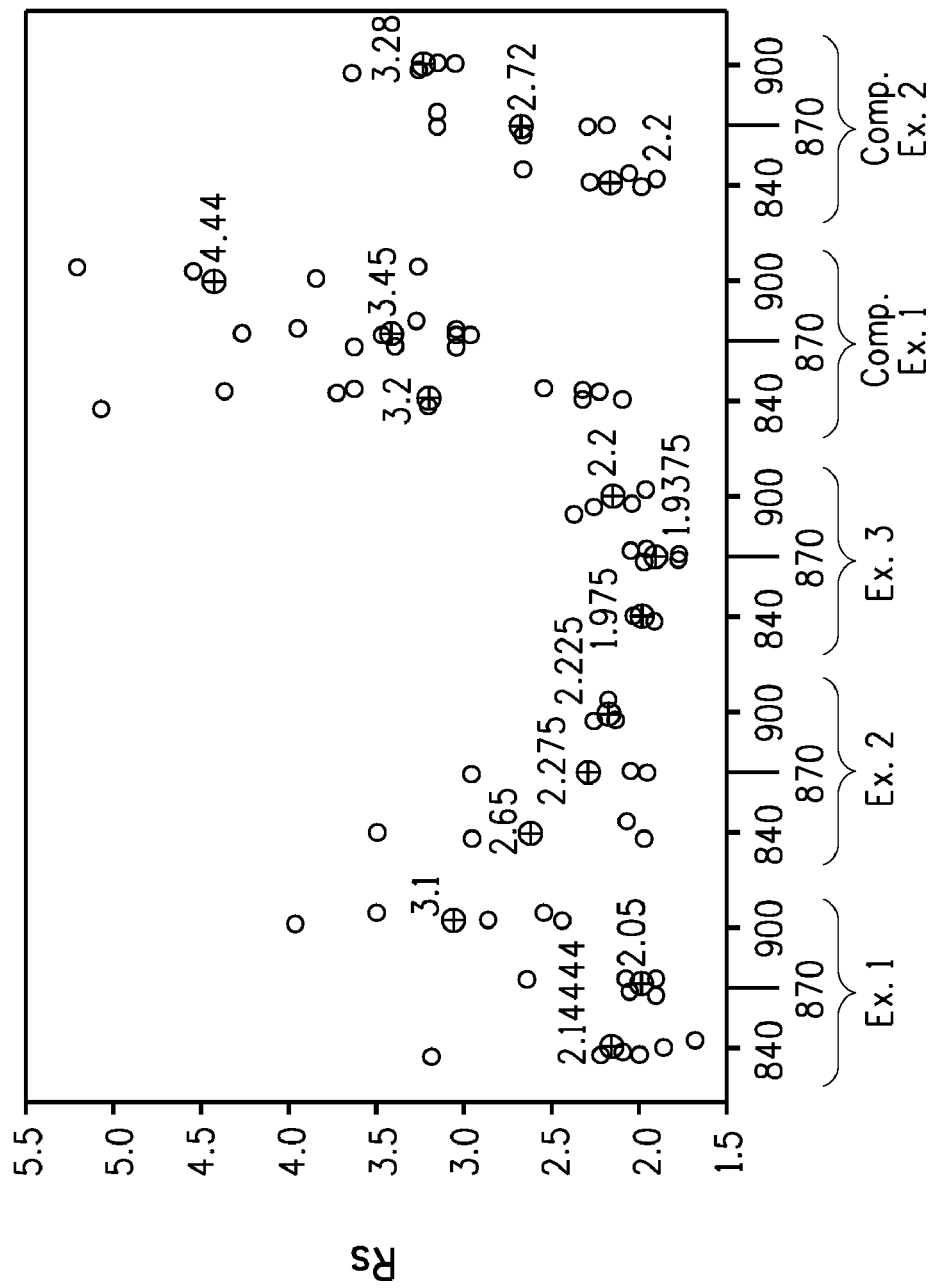

5. Study of Specific Surface Area of Zinc Oxide Powder and Set Peak Sintering Temperature Electrode pastes for a solar cell were produced using samples of the examples and comparative examples followed by measuring Rs values for two set peak sintering temperatures (840 and 900° C.) and calculating the average value thereof. Those results are shown in Tables 3 and 4, while the results combined with those at 870° C. from the previous section are shown in FIG. 3.

TABLE 3

| 840° C. | Units | Example 1 | Example 2 | Example 3 | Comparative Example 1 | Comparative Example 2 |
|---|---|---|---|---|---|---|
| Rs | mΩ· cm² | 1.9 | 4.3 | 2.0 | 2.4 | 2.3 |
|  |  | 1.9 | 3.5 | 1.9 | 2.1 | 2.0 |
|  |  | 3.2 | 2.0 | 2.0 | 2.4 | 2.0 |
|  |  | 2.1 | 2.1 | 2.0 | 2.6 | 2.7 |
|  |  | 1.7 |  |  | 2.3 | 1.9 |
|  |  | 2.2 |  |  | 3.8 |  |
|  |  | 2.0 |  |  | 4.4 |  |
|  |  | 2.2 |  |  | 3.7 |  |
|  |  | 2.1 |  |  | 3.2 |  |
|  |  |  |  |  | 5.1 |  |
| Avg. |  | 2.1 | 2.9 | 2.0 | 3.2 | 2.2 |

TABLE 4

| 900° C. | Units | Example 1 | Example 2 | Example 3 | Comparative Example 1 | Comparative Example 2 |
|---|---|---|---|---|---|---|
| Rs | mΩ· cm² | 2.9 | 2.2 | 2.0 | 4.6 | 3.2 |
|  |  | 2.6 | 2.3 | 2.1 | 5.2 | 3.3 |
|  |  | 2.5 | 2.2 | 2.4 | 3.9 | 3.1 |
|  |  | 4.0 | 2.2 | 2.3 | 3.3 | 3.7 |
|  |  | 3.5 |  |  | 5.2 | 3.1 |
| Avg. |  | 3.1 | 2.2 | 2.2 | 4.5 | 3.3 |

As is clear from the above results, lower values of Rs were determined to be able to be attained over a wide temperature of firing conditions the smaller the specific surface area, while also resulting in a greater degree of freedom for firing temperature. For example, in FIG. 3, assuming specifications of 2.5 mΩ·cm² or less, low Rs values were able to be realized over a wide firing temperature range in Examples 1 to 3. Namely, there is little susceptibility to the occurrence of defective products even if a small discrepancy has occurred between the target temperature and actual temperature during firing. In addition, there was a high degree of freedom for adjusting production conditions in consideration of other factors, thereby facilitating determination of optimum conditions during production. This offers an extremely large advantage in the actual production setting.

What is claimed is:

1. An electrode paste for a solar cell comprising: electrically conductive particles, glass frit, a resin binder and zinc oxide particles, wherein zinc oxide particles having a specific surface area of 6 m²/g or less are contained at 30% by weight or more based on the total amount of zinc oxide, and the zinc oxide is present at 0.1 to 10.0%, by weight, based on the weight of the paste.

2. The electrode paste according to claim 1, wherein the glass frit is lead-free.

3. The electrode paste of claim 2, wherein the glass frit is a zinc borosilicate glass.

4. The electrode paste of claim 1 wherein the electrically conductive particles comprise one or more particles selected from the group consisting of:
   silver particles, gold particles, palladium particles, copper particles, aluminum particles and particles of alloys of these metals.

5. The electrode paste of claim 4 wherein the electrically conductive particles comprise silver particles.

6. The electrode paste of claim 5 wherein the electrically conductive particles have a particle diameter of 0.1 to 14 μm.

7. The electrode paste of claim 5 wherein the silver particles are 70 to 90% by weight, based on the weight of the paste.

8. The electrode paste of claim 1, wherein the specific surface area of the zinc oxide particles is measured by the BET method.

9. The electrode paste of claim 8, wherein the electrically conductive particles comprise silver particles, wherein the glass frit is 1.0 to 3.0%, by weight, based on the weight of the paste, and wherein the glass frit is a zinc borosilicate glass.

10. The electrode paste of claim 9, wherein the silver particles are 70 to 90% by weight, based on the weight of the paste.

11. The electrode paste of claim 1, wherein the glass frit is 0.5 to 10%, by weight, based on the weight of the paste.

12. The electrode paste of claim 11, wherein the glass frit is 1.0 to 3.0%, by weight, based on the weight of the paste.

13. A solar cell formed from the electrode paste of claim 1.

14. A method of making a solar cell comprising:
  (a) printing the electrode paste of claim 1 on the top of a silicon substrate;
  (b) drying the paste; and
  (c) firing the silicon substrate and dried paste.

* * * * *

UNITED STATES PATENT AND TRADEMARK OFFICE
CERTIFICATE OF CORRECTION

PATENT NO. : 7,736,545 B2
APPLICATION NO. : 12/355961
DATED : June 15, 2010
INVENTOR(S) : Konno Takuya It is certified that error appears in the above-identified patent and that said Letters Patent is hereby corrected as shown below:

Column 6, Line 11: "Si•Bo•O" should read -- "Si•B•O" --

Signed and Sealed this

Thirtieth Day of November, 2010

David J. Kappos
*Director of the United States Patent and Trademark Office*